United States Patent
Lee et al.

(10) Patent No.: US 11,473,035 B2
(45) Date of Patent: *Oct. 18, 2022

(54) PROCESS SOLUTION COMPOSITION FOR EXTREME ULTRAVIOLET LITHOGRAPHY, AND METHOD FOR FORMING PATTERN BY USING SAME

(71) Applicant: YOUNG CHANG CHEMICAL CO., LTD, Gyeongsangbuk-do (KR)

(72) Inventors: Su Jin Lee, Daegu (KR); Seung Hun Lee, Daegu (KR); Seung Hyun Lee, Daegu (KR)

(73) Assignee: YOUNG CHANG CHEMICAL CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/054,371

(22) PCT Filed: May 22, 2019

(86) PCT No.: PCT/KR2019/006127
§ 371 (c)(1),
(2) Date: Nov. 10, 2020

(87) PCT Pub. No.: WO2019/240398
PCT Pub. Date: Dec. 19, 2019

(65) Prior Publication Data
US 2021/0214649 A1 Jul. 15, 2021

(30) Foreign Application Priority Data
Jun. 14, 2018 (KR) ........................ 10-2018-0068034

(51) Int. Cl.
| | | |
|---|---|---|
| *C11D 1/72* | (2006.01) | |
| *C11D 3/30* | (2006.01) | |
| *C11D 11/00* | (2006.01) | |
| *G03F 7/20* | (2006.01) | |
| *G03F 7/42* | (2006.01) | |
| *C11D 1/722* | (2006.01) | |
| *C11D 1/62* | (2006.01) | |
| *B08B 3/08* | (2006.01) | |

(52) U.S. Cl.
CPC .............. *C11D 1/72* (2013.01); *B08B 3/08* (2013.01); *C11D 1/62* (2013.01); *C11D 1/722* (2013.01); *C11D 3/30* (2013.01); *C11D 11/0047* (2013.01); *G03F 7/2004* (2013.01); *G03F 7/42* (2013.01)

(58) Field of Classification Search
CPC .. C11D 1/72; C11D 1/722; C11D 1/62; C11D 3/30
USPC ............... 510/175, 176, 421, 504, 505, 506; 134/1.2, 1.3
See application file for complete search history.

(56) References Cited

U.S. PATENT DOCUMENTS

| | | | | |
|---|---|---|---|---|
| 8,987,181 | B2* | 3/2015 | Pollard | ............... C11D 3/2096 510/176 |
| 2010/0167972 | A1* | 7/2010 | Kawase | ............ H01L 21/02074 510/175 |
| 2016/0208201 | A1* | 7/2016 | Kumagai | ............. C11D 7/3209 |

FOREIGN PATENT DOCUMENTS

| | | |
|---|---|---|
| JP | 2017-027047 A | 2/2017 |
| KR | 10-2003-0043190 A | 6/2003 |
| KR | 10-2005-0082810 A | 8/2005 |
| KR | 10-2013-0123164 A | 11/2013 |
| KR | 10-2017-0003362 A | 1/2017 |
| KR | 10-1957876   * | 3/2019 |
| KR | 10-1957876 B1 | 3/2019 |
| WO | 2017-130825 A1 | 8/2017 |

OTHER PUBLICATIONS

English Language Machine Translation of KR10-20130123164; specification. (Year: 2013).*
English Language Machine Translation of KR10-1957876; specification (Year: 2019).*

* cited by examiner

*Primary Examiner* — Gregory R Delcotto
(74) *Attorney, Agent, or Firm* — Novick, Kim & Lee PLLC; Jae Youn Kim

(57) ABSTRACT

A processing solution composition for reducing collapse of a polyhydroxystyrene-containing photoresist pattern defined by an extreme-ultraviolet exposure source and a method of forming a pattern using the same are proposed. The processing solution composition includes 0.0001 to 1 wt % of a nonionic surfactant having an HLB (Hydrophilic-Lipophilic Balance) value of 9 to 16, 0.0001 to 1 wt % of an alkaline material selected from the group consisting of tetraethylammonium hydroxide, tetrapropylammonium hydroxide, tetrabutylammonium hydroxide, and mixtures thereof, and 98 to 99.9998 wt % of water, and is effective at reducing the collapse of a polyhydroxystyrene-containing photoresist pattern defined by an extreme-ultraviolet exposure source.

3 Claims, No Drawings

PROCESS SOLUTION COMPOSITION FOR EXTREME ULTRAVIOLET LITHOGRAPHY, AND METHOD FOR FORMING PATTERN BY USING SAME

TECHNICAL FIELD

The present disclosure relates to a processing solution composition for reducing collapse of a polyhydroxystyrene-containing photoresist pattern, suitable for use in extreme-ultraviolet lithography during a process of manufacturing a semiconductor, and to a method of forming a pattern using the composition.

BACKGROUND ART

In a process of manufacturing a semiconductor, in order to form a finer pattern, a light source of a smaller wavelength band is required. Currently, lithography technology using an extreme-ultraviolet (EUV, 13.5 nm wavelength) light source is actively used, and a finer pattern may be realized using the same. However, since the etching resistance of an extreme-ultraviolet photoresist is still not improved, a photoresist pattern having a large aspect ratio is constantly required, which easily leads to pattern collapse during development, so there is a problem in that the processing margin is greatly reduced in the manufacturing process.

Accordingly, it is required to develop techniques for reducing the incidence of collapse during the formation of a fine pattern. In order to reduce the incidence of pattern collapse, it may be ideal to improve the performance of the photoresist, but the reality that it is difficult to develop a novel photoresist that satisfies all performance aspects cannot be ignored.

Aside from the need to develop novel photoresists having excellent characteristics, efforts to reduce the incidence of pattern collapse in other ways are ongoing.

DISCLOSURE

Technical Problem

An objective of the present disclosure is to provide a method of reducing the incidence of pattern collapse during photoresist development in a fine patterning process using extreme ultraviolet rays, and a processing solution composition therefor.

Another objective of the present disclosure is to provide a method of forming a photoresist pattern having good quality using the processing solution composition described above.

Technical Solution

In order to solve the technical problem, the present disclosure is intended to provide a processing solution composition for reducing collapse of a polyhydroxystyrene-containing photoresist pattern, defined by an extreme-ultraviolet exposure source, based on continuous research and experimentation on the type, amount and HLB value of nonionic surfactant, the type and amount of alkaline material, and the amount of pure water.

The aqueous cleaning solution used during the development process may include a variety of surfactants, but in the present disclosure, based on the results of conducting various studies based on the value of HLB (Hydrophilic-Lipophilic Balance), an effective cleaning solution is prepared using a nonionic surfactant having an HLB value of 9 to 16.

The HLB value is a representative basis for distinguishing characteristics between nonionic surfactants. An HLB value falls in the range of 0 to 20. When the HLB value is closer to 0, the hydrophobic (lipophilic) property of the nonionic surfactant is strong, and when the HLB value is closer to 20, the hydrophilic property of the nonionic surfactant is strong.

When a nonionic surfactant that exhibits hydrophobicity is added to an aqueous cleaning solution that mostly contains ultrapure water, hydrophobization of the photoresist wall is induced, making it possible to reduce melting and collapse of the pattern, but there is a concern in that defects may form due to agglomeration of the nonionic surfactant during use thereof because the physical properties of the cleaning solution are not uniform due to the strong tendency of the nonionic surfactant to agglomerate.

In the present invention, it is confirmed that the smaller the HLB value of the nonionic surfactant, the better the effect of reducing pattern collapse. However, when the nonionic surfactant is used in an excessively large amount or the HLB value is 8 or less, agglomeration of the surfactant may occur in an aqueous cleaning solution that contains mostly ultrapure water.

In contrast, when using a nonionic surfactant that exhibits hydrophilicity, it may be uniformly dispersed without agglomeration in an aqueous cleaning solution that contains mostly ultrapure water to afford a cleaning solution having uniform physical properties, and after exposure and development, pattern collapse may be reduced by lowering the capillary force due to adsorption of the surfactant to the wall of portions of the hydrophilized photoresist. However, there is a concern in that the surfactant that is strongly hydrophilic may cause melting of the photoresist pattern, eventually incurring pattern collapse.

In the present disclosure, based on the results of thorough research and experimentation, it can be confirmed that ability to reduce pattern collapse is poor when the HLB value of the nonionic surfactant is 17 or more.

A representative developer that is currently used in most photolithography development processes is configured to include mainly pure water and tetramethylammonium hydroxide diluted to a predetermined concentration. In most processes, a mixture of 2.38 wt % of tetramethylammonium hydroxide and 97.62 wt % of water is used, and even in the extreme-ultraviolet lithography process, the developer that is currently used includes pure water and diluted tetramethylammonium hydroxide.

In the present disclosure, pattern collapse is observed when cleaning with pure water alone after development during the extreme-ultraviolet lithography process.

Moreover, pattern collapse is observed even when a cleaning solution including pure water and tetramethylammonium hydroxide is applied after development during the extreme-ultraviolet lithography process, or even when a cleaning solution including pure water and tetramethylammonium hydroxide is applied after cleaning with pure water alone.

Based on these results, it is presumed that, in the case of the cleaning solution including pure water and tetramethylammonium hydroxide, the pattern is destroyed due to weakening of the fine pattern exposed to extreme ultraviolet rays and due to large or uneven capillary force.

In the present disclosure, in order to reduce collapse of the pattern exposed to extreme ultraviolet rays and also to reduce the LWR (Line Width Roughness) and defects in the photoresist pattern in the extreme-ultraviolet process, it is necessary to search for an alkaline material that has a relatively less influence on the exposed pattern than tetramethylammonium hydroxide, and thus research and experimentation thereon have been continuously conducted.

In the present disclosure, it is confirmed that, when using tetraethylammonium hydroxide, tetrapropylammonium hydroxide, or tetrabutylammonium hydroxide, other than tetramethylammonium hydroxide, among alkaline materials, pattern collapse is avoided and LWR and defects are reduced.

Therefore, a preferred first embodiment of the present disclosure provides a rinse solution for reducing the incidence of pattern collapse during photoresist development, including 0.0001 to 1 wt % of an alkaline material selected from the group consisting of tetraethylammonium hydroxide, tetrapropylammonium hydroxide, tetrabutylammonium hydroxide, and mixtures thereof, 0.0001 to 1 wt % of a nonionic surfactant having an HLB value of 9 to 16, and 98 to 99.9998 wt % of water.

In the above embodiment, the surfactant may be a non-ionic surfactant.

In the above embodiment, the nonionic surfactant may be selected from the group consisting of polyoxyethylene alkyl ether, polyoxypropylene alkyl ether, polyoxyethylene oxypropylene alkyl ether, and mixtures thereof.

In the above embodiment, the HLB value of polyoxyethylene alkyl ether, polyoxypropylene alkyl ether, or polyoxyethylene oxypropylene alkyl ether may fall in the range of 9 to 16.

In addition, the present disclosure provides a method of forming a photoresist pattern, including: (a) forming a photoresist film by applying a photoresist on a semiconductor substrate; (b) forming a photoresist pattern by exposing and developing the photoresist film; and (c) cleaning the photoresist pattern with the processing solution composition for photolithography described above.

The cause of the pattern collapse is deemed to be due to the capillary force generated between the patterns when the pattern is cleaned with pure water after development, but it is confirmed that the pattern collapse cannot be completely prevented even though the capillary force is reduced.

In order to reduce the capillary force, in the case in which an inappropriate surfactant is excessively used for the purpose of lowering the surface tension of the rinse solution, melting of the pattern may occur, which may lead to further collapse of the pattern.

In order to reduce pattern collapse, it is important to select a surfactant that does not cause melting of the photoresist pattern while reducing the surface tension of the cleaning solution.

The cleaning solution of the present disclosure exhibits an excellent effect on a photoresist using an extreme-ultraviolet light source. In particular, there is an effect of reducing the incidence of pattern collapse during development of a photoresist in which the resin, which is the main component of the photoresist, is polyhydroxystyrene.

Advantageous Effects

According to the present disclosure, a processing solution composition for photolithography can help to form a polyhydroxystyrene-containing photoresist pattern defined by an extreme-ultraviolet exposure source. In particular, a simple process is added, whereby the collapse of the pattern, which is difficult to form using a photoresist alone, can be reduced, thereby reducing production costs.

BEST MODE

Hereinafter, a detailed description will be given of the present disclosure.

The present disclosure pertains to a processing solution for reducing the incidence of pattern collapse during photoresist development, including 0.0001 to 1 wt % of an alkaline material selected from the group consisting of tetraethylammonium hydroxide, tetrapropylammonium hydroxide, tetrabutylammonium hydroxide, and mixtures thereof, 0.0001 to 1 wt % of a nonionic surfactant having an HLB (Hydrophilic-Lipophilic Balance) value of 9 to 16, and 98 to 99.9998 wt % of water.

A better understanding of the present disclosure will be given through the following examples and comparative examples. These examples are merely set forth to illustrate the present disclosure, and are not to be construed as limiting the scope of the present disclosure.

MODE FOR DISCLOSURE

Examples and Comparative Examples

Example 1

A processing solution for reducing the incidence of collapse of a photoresist pattern, including 0.01 wt % of polyoxyethylene alkyl ether having an HLB value of 9 and 0.01 wt % of tetrabutylammonium hydroxide, was prepared as follows.

0.01 wt % of polyoxyethylene alkyl ether having an HLB value of 9 and 0.01 wt % of tetrabutylammonium hydroxide were added to 99.98 wt % of deionized (DI) water, stirred for 5 hr, and passed through a 0.01 μm filter to remove fine solid impurities, thereby preparing a processing solution for reducing the incidence of collapse of a photoresist pattern.

Example 2 to Example 20

Respective processing solutions for reducing the incidence of collapse of a photoresist pattern were prepared in the same manner as in Example 1 using components in the amounts shown in Tables 1 to 5 below.

Comparative Example 1

Pure water (DI water), which is typically used as the final processing solution of the development process in a process of manufacturing a semiconductor device, was prepared.

Comparative Example 2 to Comparative Example 9

For comparison with Examples, respective processing solutions were prepared in the same manner as in Example 1, using components in the amounts shown in Tables 1 to 5 below.

TABLE 1

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 1 | Polyoxyethylene alkyl ether | 9 | 0.01 | Tetrabutylammonium hydroxide | 0.01 | DI water | 99.9800 |
| Example 2 | Polyoxyethylene alkyl ether | 10 | 0.01 | Tetrabutylammonium hydroxide | 0.01 | DI water | 99.9800 |
| Example 3 | Polyoxyethylene alkyl ether | 11 | 0.01 | Tetrabutylammonium hydroxide | 0.01 | DI water | 98.9800 |
| Example 4 | Polyoxyethylene alkyl ether | 12 | 0.01 | Tetrabutylammonium hydroxide | 0.01 | DI water | 98.9800 |
| Example 5 | Polyoxyethylene alkyl ether | 13 | 0.01 | Tetrabutylammonium hydroxide | 0.01 | DI water | 99.9800 |
| Example 6 | Polyoxyethylene alkyl ether | 14 | 0.01 | Tetrabutylammonium hydroxide | 0.01 | DI water | 99.9800 |
| Example 7 | Polyoxyethylene alkyl ether | 15 | 0.01 | Tetrabutylammonium hydroxide | 0.01 | DI water | 99.9800 |
| Example 8 | Polyoxyethylene alkyl ether | 16 | 0.01 | Tetrabutylammonium hydroxide | 0.01 | DI water | 99.9800 |
| Comparative Example 1 | — | — | — | — | — | DI water | 100 |
| Comparative Example 2 | Polyoxyethylene alkyl ether | 8 | 0.01 | Tetrabutylammonium hydroxide | 0.01 | DI water | 99.9800 |
| Comparative Example 3 | Polyoxyethylene alkyl ether | 17 | 0.01 | Tetrabutylammonium hydroxide | 0.01 | DI water | 99.9800 |

TABLE 2

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 9 | Polyoxyethylene alkyl ether | 10 | 0.0001 | Tetrabutylammonium hydroxide | 0.01 | DI water | 99.9899 |
| Example 10 | Polyoxyethylene alkyl ether | 10 | 0.001 | Tetrabutylammonium hydroxide | 0.01 | DI water | 99.9890 |
| Example 11 | Polyoxyethylene alkyl ether | 10 | 0.1 | Tetrabutylammonium hydroxide | 0.01 | DI water | 99.8900 |
| Example 12 | Polyoxyethylene alkyl ether | 10 | 1 | Tetrabutylammonium hydroxide | 0.01 | DI water | 98.9900 |
| Comparative Example 4 | — | — | — | Tetrabutylammonium hydroxide | 0.01 | DI water | 99.9900 |
| Comparative Example 5 | Polyoxyethylene alkyl ether | 10 | 2 | Tetrabutylammonium hydroxide | 0.01 | DI water | 97.9900 |

TABLE 3

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 13 | Polyoxyethylene alkyl ether | 10 | 0.01 | Tetrabutylammonium hydroxide | 0.0001 | DI water | 99.9899 |
| Example 14 | Polyoxyethylene alkyl ether | 10 | 0.01 | Tetrabutylammonium hydroxide | 0.001 | DI water | 99.9890 |
| Example 15 | Polyoxyethylene alkyl ether | 10 | 0.01 | Tetrabutylammonium hydroxide | 0.1 | DI water | 99.8900 |
| Example 16 | Polyoxyethylene alkyl ether | 10 | 0.01 | Tetrabutylammonium hydroxide | 1 | DI water | 98.9900 |
| Comparative Example 6 | Polyoxyethylene alkyl ether | 10 | 0.01 | — | — | DI water | 99.9900 |
| Comparative Example 7 | Polyoxyethylene alkyl ether | 10 | 0.01 | Tetrabutylammonium hydroxide | 2 | DI water | 97.9900 |

TABLE 4

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 17 | Polyoxypropylene alkyl ether | 10 | 0.01 | Tetrabutylammonium hydroxide | 0.01 | DI water | 99.9800 |
| Example 18 | Polyoxyethylene oxypropylene alkyl ether | 10 | 0.01 | Tetrabutylammonium hydroxide | 0.01 | DI water | 99.9800 |

TABLE 5

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 19 | Polyoxyethylene alkyl ether | 10 | 0.01 | Tetraethylammonium hydroxide | 0.01 | DI water | 99.9800 |
| Example 20 | Polyoxyethylene alkyl ether | 10 | 0.01 | Tetrapropylammonium hydroxide | 0.01 | DI water | 99.9800 |
| Comparative Example 8 | Polyoxyethylene alkyl ether | 10 | 0.01 | Tetramethylammonium hydroxide | 0.01 | DI water | 99.9800 |
| Comparative Example 9 | Polyoxyethylene alkyl ether | 10 | 0.01 | Tetrapentylammonium hydroxide | 0.01 | DI water | 99.9800 |

Test Examples and Comparative Test Examples

The pattern, formed by applying a photoresist on a semiconductor substrate to form a photoresist film and exposing and developing the photoresist film to form a pattern, was cleaned using the processing solution composition of each of Example 1 to Example 20 and Comparative Example 1 to Comparative Example 9, after which the silicon wafer having the pattern formed thereon was measured for pattern collapse and a defect number reduction ratio. The results thereof are shown as Test Example 1 to Test Example 20 and Comparative Test Example 1 to Comparative Test Example 9 in Table 6 below.

(1) Prevention of Pattern Collapse

After exposure and focus splitting, the number of blocks in which the pattern did not collapse out of the total of 89 blocks was measured using a critical dimension scanning electron microscope (CD-SEM, Hitachi).

(2) Defect Number Ratio

For the photoresist pattern rinsed with each rinse solution sample using a surface defect observation device [KLA, Tencor], the number of defects (A) was measured and expressed as a percentage (%) of the number of defects (B) observed upon rinsing with pure water alone, that is, (A/B)×100.

The number of defects after treatment with pure water alone was set to 100% as a standard, and the extent of decrease or increase is expressed as a percentage compared to 100%, as the number of defects when treated with pure water alone, which is referred to as the defect number ratio (decrease or increase ratio). Here, a lower value is judged to be better.

(3) Transparency

The transparency of the prepared cleaning solution was observed with the naked eye and indicated as transparent or opaque.

TABLE 6

| | Number of blocks without pattern collapse | Defect number reduction ratio (%) | Transparency |
|---|---|---|---|
| Example 1 | 75 | 50 | Transparent |
| Example 2 | 77 | 30 | Transparent |
| Example 3 | 71 | 38 | Transparent |
| Example 4 | 70 | 43 | Transparent |
| Example 5 | 65 | 50 | Transparent |
| Example 6 | 61 | 65 | Transparent |
| Example 7 | 52 | 79 | Transparent |
| Example 8 | 50 | 83 | Transparent |
| Example 9 | 55 | 53 | Transparent |
| Example 10 | 63 | 46 | Transparent |
| Example 11 | 64 | 35 | Transparent |
| Example 12 | 68 | 80 | Transparent |
| Example 13 | 70 | 81 | Transparent |
| Example 14 | 72 | 53 | Transparent |
| Example 15 | 75 | 38 | Transparent |
| Example 16 | 66 | 96 | Transparent |
| Example 17 | 70 | 42 | Transparent |
| Example 18 | 68 | 47 | Transparent |
| Example 19 | 57 | 69 | Transparent |
| Example 20 | 63 | 51 | Transparent |
| Comparative Example 1 | 46 | 100 | Transparent |
| Comparative Example 2 | 78 | 151 | Opaque |
| Comparative Example 3 | 42 | 90 | Transparent |
| Comparative Example 4 | 40 | 95 | Transparent |
| Comparative Example 5 | 41 | 327 | Opaque |
| Comparative Example 6 | 65 | 118 | Transparent |
| Comparative Example 7 | 40 | 126 | Transparent |
| Comparative Example 8 | 38 | 149 | Transparent |
| Comparative Example 9 | 43 | 97 | Transparent |

Based on the results of comparison of Test Examples 1 to 8 with Comparative Test Examples 1 to 3, when the HLB value of the surfactant was 9 to 16, the number of blocks that did not exhibit pattern collapse was increased, the number of defects was reduced, and all of the cleaning solutions thereof were transparent. In particular, when the HLB value was 9 to 13, vastly superior effects were exhibited.

Based on the results of comparison of Test Examples 2 and 9 to 12 with Comparative Test Examples 4 and 5, when the amount of the surfactant was 0.0001 to 1 wt %, the number of blocks not exhibiting pattern collapse was increased, the number of defects was reduced, and all of the cleaning solutions thereof were transparent.

Based on the results of comparison of Test Examples 2 and 13 to 16 with Comparative Test Examples 6 and 7, when the amount of the alkaline material was 0.0001 to 1 wt %, the number of blocks not exhibiting pattern collapse was increased, the number of defects was reduced, and all of the cleaning solutions thereof were transparent.

Based on the results of comparison of Test Examples 2, 17 and 18 with Comparative Test Example 1, when the surfactant was polyoxyethylene alkyl ether, polyoxypropylene alkyl ether, or polyoxyethylene oxypropylene alkyl ether, the number of blocks not exhibiting pattern collapse was increased, the number of defects was reduced, and all of the cleaning solutions thereof were transparent. In particular, when the surfactant was polyoxyethylene alkyl ether, vastly superior effects were exhibited.

Based on the results of a comparison of Test Examples 2, 19 and 20 with Comparative Test Examples 8 and 9, when the alkaline material was tetraethylammonium hydroxide, tetrapropylammonium hydroxide, or tetrabutylammonium hydroxide, the number of blocks not exhibiting pattern collapse was increased, the number of defects was reduced, and all of the cleaning solutions thereof were transparent. In particular, when the alkaline material was tetrabutylammonium hydroxide, vastly superior effects were exhibited.

Meanwhile, based on the results of evaluation of the pattern collapse of Example 2, it was confirmed that the number of blocks in which pattern collapse did not occur was 77, indicative of vastly superior effects.

In contrast, based on the results of evaluation of the pattern collapse of Comparative Example 1, it was confirmed that the number of blocks in which pattern collapse did not occur was 46, indicative of poor effects.

Although specific embodiments of the present disclosure have been disclosed in detail above, it will be obvious to those skilled in the art that the description is merely of preferable exemplary embodiments and is not to be construed to limit the scope of the present disclosure. Therefore, the substantial scope of the present disclosure will be defined by the appended claims and equivalents thereof.

The invention claimed is:

1. A processing solution composition for reducing collapse of a polyhydroxystyrene-containing photoresist pattern defined by an extreme-ultraviolet exposure source, comprising:
   0.0001 to 1 wt % of a nonionic surfactant having Hydrophilic-Lipophilic Balance value of 9 to 13, wherein the nonionic surfactant is a polyoxyethylene alkyl ether;
   0.0001 to 1 wt % of tetrabutylammonium hydroxide; and
   98 to 99.9998 wt % of water.

2. A method of forming a photoresist pattern, comprising:
   (a) forming a photoresist film by applying a photoresist on a semiconductor substrate;
   (b) forming a photoresist pattern by exposing and developing the photoresist film; and
   (c) cleaning the photoresist pattern with the processing solution composition of claim 1.

3. The method of claim 2, wherein the exposing is performed using an extreme-ultraviolet exposure source.

* * * * *